US006391745B1

(12) United States Patent
Kwon

(10) Patent No.: US 6,391,745 B1
(45) Date of Patent: May 21, 2002

(54) METHOD FOR FORMING OVERLAY VERNIERS FOR SEMICONDUCTOR DEVICES

(75) Inventor: Won Taik Kwon, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 09/737,807

(22) Filed: Dec. 18, 2000

(30) Foreign Application Priority Data

Dec. 16, 1999 (KR) .............................. 99-58392

(51) Int. Cl.[7] .......................................... H01L 21/301
(52) U.S. Cl. ...................... 438/462; 438/401; 438/633; 438/975; 257/797
(58) Field of Search ......................... 257/797; 438/401, 438/462, 975, 633

(56) References Cited

U.S. PATENT DOCUMENTS

| 5,503,962 | A | * | 4/1996 | Caldwell ..................... 430/317 |
| 5,898,227 | A | * | 4/1999 | Geffken et al. .............. 257/797 |
| 5,919,714 | A | * | 7/1999 | Chen et al. .................. 438/692 |
| 5,935,764 | A | * | 8/1999 | Kakehashi .................. 430/314 |
| 6,133,111 | A | * | 10/2000 | Sur et al. ..................... 438/401 |
| 6,316,328 | B1 | * | 11/2001 | Komuro ..................... 438/401 |

FOREIGN PATENT DOCUMENTS

JP         2001-203159      *  7/2001

* cited by examiner

Primary Examiner—Carl Whitehead, Jr.
Assistant Examiner—Jeff Vockrodt
(74) Attorney, Agent, or Firm—Pillsbury Winthrop LLP

(57) ABSTRACT

The present invention discloses a method for forming an overlay vernier that can prevents deformation of the mother vernier. The method comprises the steps of: forming a planarization film on a wafer where a predetermined basic substructure has been formed; etching the planarization film to expose a predetermined region of a scribe line of the wafer where the overlay vernier will be formed; depositing a first polysilicon layer on the planarization film and the exposed wafer region; polishing the first polysilicon layer until the surface of the planarization film is exposed; forming an interlayer insulating film on the planarization film and the remained first polysilicon layer; etching the interlayer insulating film to expose a region of the first polysilicon layer where the mother vernier of the overlay vernier will be formed; depositing a second polysilicon layer on the interlayer insulating film and the exposed first polysilicon layer; and patterning the second polysilicon layer to form the mother vernier.

8 Claims, 3 Drawing Sheets

METHOD FOR FORMING OVERLAY VERNIERS FOR SEMICONDUCTOR DEVICES

BACKGROUND OF THE INVENTION

1. Field of the Invention

The present invention relates to a method for forming overlay alignment structures, such as an overlay vernier, for semiconductor devices and, in particular, to an improved method for forming an overlay alignment structure that prevents deformation of the alignment target or mother vernier.

2. Description of the Background Art

During the production of semiconductor devices having a stacked structure, photolithography processes are commonly used to produce various functional device structures. Because the relative position of structures formed from sequential layers is critical to the performance of the resulting semiconductor devices, alignment structures, such as overlay verniers, are typically formed during each photolithography process in order to observe, evaluate and possibly correct misalignment between a previously-formed layer and a current layer. An overlay vernier typically consists of a mother vernier that was formed in a previous process, and a corresponding son vernier that is formed during the current process. The overlay vernier is generally formed on a scribe line of a wafer. Typically, the mother vernier comprises a structure formed during a previous etch process on a layer underlying the current layer and the corresponding son vernier is formed from a portion of the photoresist pattern for the current layer.

FIG. 1A is a cross-sectional view illustrating the mother vernier formed in a second polysilicon layer (poly2) layer, and FIG. 1B is a plan view illustrating the mother vernier.

Referring to FIGS. 1A and 1B, the mother vernier 3 is formed when the poly2 layer, i.e., the bit line pattern, is being formed in the cell regions. In this illustration, the mother vernier 3 is formed in a box shape, and has in its center portion an alignment space for the son vernier that will be formed in a subsequent process. In addition, the mother vernier 3, like the poly2 pattern, is formed on an interlayer insulating film 2 that is intended to prevent electrical contact between the gate electrode and the bit line. One material that has proven suitable for forming the interlayer insulating film 2 is a plasma enhanced tetraethylorthosilicate (PE-TEOS).

As shown in FIG. 1A, a flowable insulating film 1, for example a BPSG film, is commonly used to planarize the surface of the substrate after a first set of polysilicon structures have been formed from the poly1 layer (not shown). The PE-TEOS film 2 is formed on the BPSG film 1, and the mother vernier 3 is, in turn, formed on the PE-TEOS film 2.

However, the conventional mother vernier is formed on the flowable insulating film, and thus may be deformed due to shrinkage or other movement of the flowable insulating film during subsequent thermal processes. As a result, when a deformed mother vernier is used as the alignment target for forming an overlay vernier with a subsequent son vernier, the accuracy of the alignment between the upper and lower layers is decreased, thereby increasing the potential for producing shorts during subsequent metal interconnection processes.

SUMMARY OF THE INVENTION

Accordingly, an object of the present invention is to provide a method for forming an overlay vernier that can prevent the mother vernier from being deformed.

In order to achieve the above-described object of the present invention, there is provided a method for forming an overlay vernier, comprising the steps of: forming a planarization film on a wafer where a predetermined basic substructure has been formed; etching the planarization film to expose a predetermined region of a scribe line of the wafer where the overlay vernier will be formed; depositing a first polysilicon layer on the planarization film and the exposed wafer region; polishing the first polysilicon layer until the surface of the planarization film is exposed; forming an interlayer insulating film on the planarization film and the remained first polysilicon layer; etching the interlayer insulating film to expose a region of the first polysilicon layer where the mother vernier of the overlay vernier will be formed; depositing a second polysilicon layer on the interlayer insulating film and the exposed first polysilicon layer; and patterning the second polysilicon layer to form the mother vernier.

BRIEF DESCRIPTION OF THE DRAWINGS

The present invention will become better understood with reference to the accompanying figures. These figures that are provided by way of illustration only and thus should not be considered to limit unduly the present invention as defined by the claims.

DETAILED DESCRIPTION OF THE PREFERRED EMBODIMENTS

The present invention relates to a method for forming an overlay vernier, and thus FIGS. 2A to 2E illustrate only a scribe line region where the overlay vernier is formed, not a cell region.

Figure 1A:
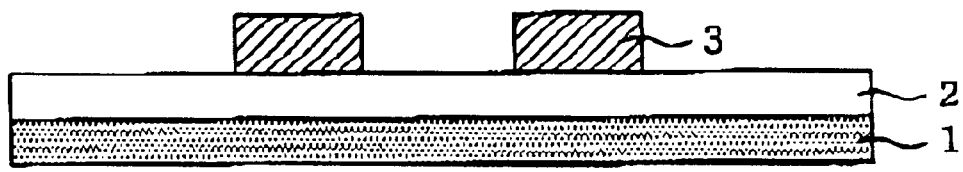
FIGS. 1A and 1B are respectively, a cross-sectional view and a plan view, illustrating a conventional mother vernier formed with a poly2 layer.
Figure 1B:
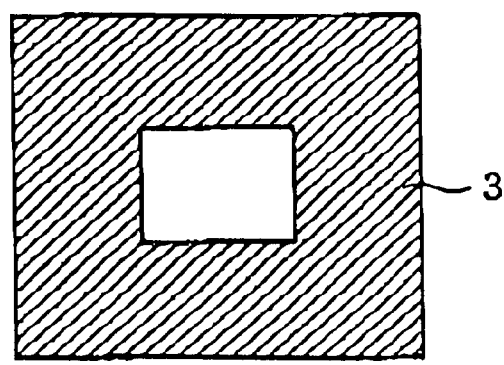
Figure 2A:
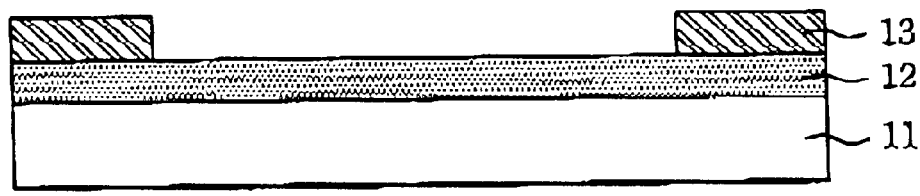
FIGS. 2A to 2E are cross-sectional views illustrating sequential steps of a method for forming an overlay vernier in accordance with a preferred embodiment of the present invention.

Referring to FIG. 2A, a wafer 11 having a predetermined basic substructure such as a transistor including a poly1 layer, i.e., a gate has been formed, is prepared. A BPSG film 12 film is then formed on the wafer 11 to act as a planarization. A first photoresist pattern 13 is formed on the BPSG film 12 to expose a region where a mother vernier of the overlay vernier will be formed.

Figure 2B:
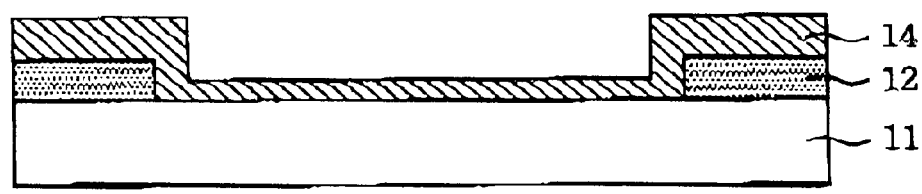

Referring to FIG. 2B, the BPSG film 12 is then etched using the first photoresist pattern 13 as an etching mask, and the first photoresist pattern 13 is removed. A first polysilicon layer 14 is then deposited on the BPSG film 12 and the exposed wafer region. Here, the first polysilicon layer 14 is a polysilicon layer used to form a plug in a poly2 contact before forming the actual poly2 layer in the cell region.

Figure 2C:
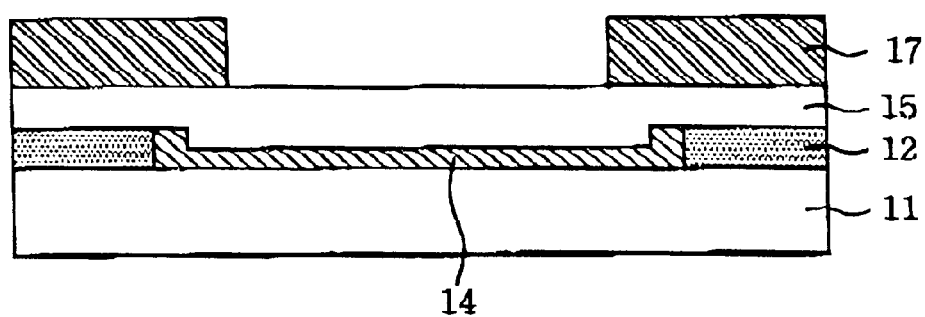

Referring to FIG. 2C, the first polysilicon layer 14 is then polished according to a chemical mechanical polishing (CMP) process until the surface of the BPSG film 12 is exposed. An interlayer insulating film 15 such as a plasma enhanced tetraethylortho silicate (PE-TEOS) film is then deposited on the BPSG film 12 and the remained first polysilicon layer 14. A second photoresist pattern 16 is then formed on the interlayer insulating film 15 to expose a predetermined region of the first polysilicon layer 14.

Figure 2D:
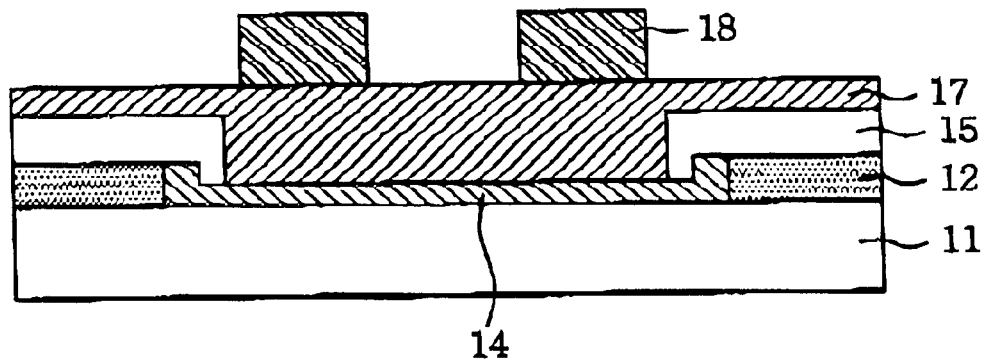

Referring to FIG. 2D, the interlayer insulating film 15 is etched using the second photoresist pattern 16 as an etching mask, thereby exposing the region of the first polysilicon layer 14 where the mother vernier will be formed. The second photoresist pattern 16 is then removed. A second polysilicon layer 17 is deposited on the exposed first polysilicon layer 14 and the interlayer insulating film 15. Here, the second polysilicon layer 17 is the polysilicon layer that will be used to form both the mother vernier and the poly2 structures, i.e., bitlines, in the cell region. A third photoresist pattern 18 is then formed on the second polysilicon layer 17 to define the shape of the mother vernier.

Figure 2E:
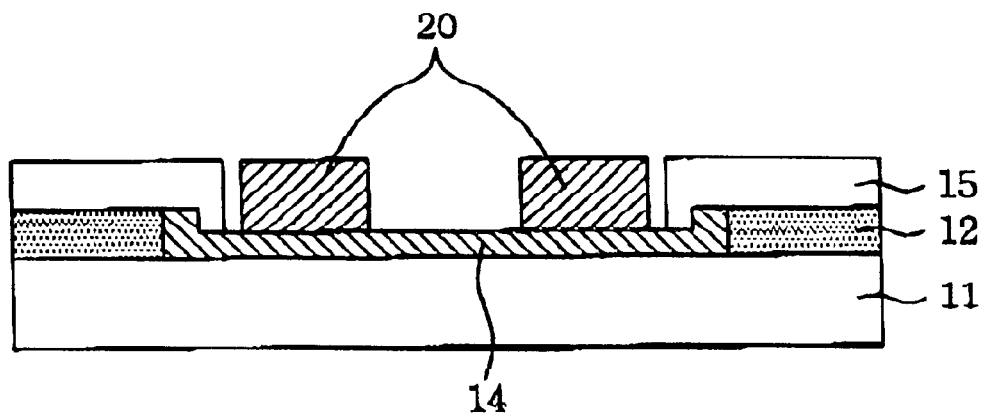

Referring to FIG. 2E, the second polysilicon layer 17 is then etched using the third photoresist pattern 18 as an etching mask, thereby forming the mother vernier 20. The third photoresist pattern 18 is then removed.

Herein, the mother vernier 20 is formed on an underlying polysilicon layer that will not tend to flow like the BPSG film at elevated temperatures, and thus will rarely be deformed by a subsequent thermal treatments. Because the underlying polysilicon layer is more stable, the mother vernier will not be deformed during the planarization processes. Therefore, the reliability and accuracy of the mother vernier 20 is increased. As a result, when the son vernier is formed on the mother vernier 20 during subsequent conventional generally-known photolithography processes, it is possible to accurately observe, evaluate and, if necessary, correct the alignment between the upper and lower layers.

Using the method described above to form an overlay vernier causes the mother vernier to be formed on a polysilicon layer that does not flow during subsequent thermal processes, and thus is not deformed by those processes. Accordingly, the resulting mother vernier is more reliable, and the overlay accuracy between the upper and lower layers is improved, thereby improving the reliability of the resulting semiconductor devices.

Various other modifications to the basic process will be apparent to and can be readily made by those skilled in the art without departing from the scope and spirit of the present invention.

What is claimed is:

1. A method for forming an overlay vernier consisting of a mother vernier and a son vernier on a wafer, comprising the steps of:

forming a planarization film on the wafer;

etching the planarization film to expose a predetermined region of the wafer to form a vernier field;

depositing a first polysilicon layer on the planarization film and the vernier field;

polishing the first polysilicon layer until the surface of the planarization film is exposed;

forming an interlayer insulating film on the planarization film and the remaining portions of the first polysilicon layer;

etching the interlayer insulating film to expose the first polysilicon layer in at least a portion of the vernier field;

depositing a second polysilicon layer on the interlayer insulating film and the exposed first polysilicon layer; and patterning and etching the second polysilicon layer to form the mother vernier in the vernier field.

2. The method according to claim 1, wherein the planarization film is a BPSG film.

3. The method according to claim 1, wherein the interlayer insulating film is a PE-TEOS film.

4. The method according to claim 1, wherein the step of etching the planarization film opens contact openings and further wherein the first polysilicon layer is used to form conductive plugs in the contact openings.

5. The method according to claim 1, wherein the second polysilicon layer is further used to form bit lines on a semiconductor device.

6. A method for forming an alignment structure comprising an alignment target on a wafer comprising the steps of:

forming a planarization film on the wafer;

forming a first photoresist pattern on the planarization film;

etching the planarization film using the first photoresist pattern as an etch mask to remove the planarization film in predetermined regions to form an alignment target wells;

depositing a sacrificial polysilicon film layer on the planarization film and the alignment target wells, the thickness of the sacrificial polysilicon film being sufficient to substantially fill the alignment target wells;

polishing the wafer to remove those portions of the sacrificial polysilicon layer not found in the alignment target wells, expose the surface of the planarization layer, and planarize the wafer;

forming an interlayer insulating film on the planarization film and the remaining portions of the sacrificial polysilicon layer;

forming a second photoresist pattern on the interlayer insulating film;

etching the interlayer insulating film using the second photoresist pattern as an etch mask to expose the sacrificial polysilicon remaining in the alignment target wells;

depositing a second polysilicon layer on the interlayer insulating film and the exposed sacrificial polysilicon layer;

forming a third photoresist pattern on the second polysilicon layer; and etching the second polysilicon layer using the third photoresist pattern as an etch mask to form target alignment structures on the alignment structure wells.

7. A method according to claim 6, further comprising the formation of a fourth photoresist pattern, the fourth photoresist pattern including an alignment structure, the alignment structure being complementary to the target alignment structure, to form an overlay alignment structure.

8. A method according to claim 7, further comprising the step of using the overlay alignment structure to evaluate the accuracy of the alignment between the fourth photoresist pattern and the second polysilicon layer.

* * * * *